United States Patent
Ru et al.

(10) Patent No.: US 10,374,104 B2
(45) Date of Patent: Aug. 6, 2019

(54) WATERPROOF ELECTRONIC PACKAGING STRUCTURE AND METHOD FOR MAKING THE SAME

(71) Applicant: Tong Hsing Electronic Industries, Ltd., Taipei (TW)

(72) Inventors: Shao-Pin Ru, Taipei (TW); Zzu-Chi Chiu, Taipei (TW)

(73) Assignee: TONG HSING ELECTRONICS INDUSTRIES, LTD., Taipei (TW)

( * ) Notice: Subject to any disclaimer, the term of this patent is extended or adjusted under 35 U.S.C. 154(b) by 0 days.

(21) Appl. No.: 15/634,404

(22) Filed: Jun. 27, 2017

(65) Prior Publication Data
US 2018/0062004 A1 Mar. 1, 2018

(30) Foreign Application Priority Data

Aug. 24, 2016 (TW) .............................. 105127044 A

(51) Int. Cl.
*H01L 31/0203* (2014.01)
*C09D 1/00* (2006.01)
(Continued)

(52) U.S. Cl.
CPC ............ *H01L 31/0203* (2013.01); *C09D 1/00* (2013.01); *C09D 201/00* (2013.01); *H01L 31/02005* (2013.01); *H01L 31/18* (2013.01)

(58) Field of Classification Search
CPC ... C09D 1/00; C09D 201/00; H01L 31/02005; H01L 31/0203; H01L 31/18
See application file for complete search history.

(56) References Cited

U.S. PATENT DOCUMENTS 6,376,769 B1 * 4/2002 Chung ................. B32B 3/08
174/260
6,661,084 B1 * 12/2003 Peterson ............. H01L 25/105
257/680
(Continued)

FOREIGN PATENT DOCUMENTS

TW 200952133 A1 12/2009
TW 201032293 A1 9/2010
TW 201600449 A 1/2016

OTHER PUBLICATIONS

Search Report appended to an Office Action, which was issued to Taiwanese counterpart application No. 105127044 by the TIPO dated Feb. 22, 2018, with an English translation thereof.

*Primary Examiner* — Allan R Wilson
(74) *Attorney, Agent, or Firm* — Muncy, Geissler, Olds & Lowe, P.C.

(57) ABSTRACT

A waterproof electronic packaging structure includes a carrier plate, a chip, an encapsulating member and a waterproof member. The carrier plate includes a substrate, and a leadframe partly embedded in the substrate and including a chip bonding portion exposed from the substrate. The chip is mounted to the substrate and is electrically connected to the chip bonding portion. The encapsulating member is formed on the carrier plate, and encapsulates the chip and the chip bonding portion. The waterproof member is formed on the encapsulating member, and covers an outer surface of the encapsulating member and an interface between the encapsulating member and the substrate. A method for making a waterproof electronic packaging structure is also disclosed.

17 Claims, 4 Drawing Sheets

(51) Int. Cl.
*C09D 201/00* (2006.01)
*H01L 31/02* (2006.01)
*H01L 31/18* (2006.01)

(56) References Cited

U.S. PATENT DOCUMENTS

| | | | |
|---|---|---|---|
| 8,212,351 B1* | 7/2012 | Debar | H01L 23/3135 257/704 |
| 2005/0012188 A1* | 1/2005 | Val | B81B 7/0041 257/678 |
| 2005/0275050 A1* | 12/2005 | Tsai | H01L 31/0203 257/433 |
| 2005/0285239 A1* | 12/2005 | Tsai | H01L 23/4951 257/676 |
| 2007/0023608 A1* | 2/2007 | Webster | H01L 27/14618 250/200 |
| 2009/0026593 A1* | 1/2009 | Kwang | H01L 24/48 257/676 |
| 2009/0212306 A1* | 8/2009 | Bogner | H01L 31/0203 257/98 |
| 2011/0049730 A1* | 3/2011 | Schmid | C23C 16/0272 257/787 |
| 2013/0020590 A1* | 1/2013 | Lin | H01L 33/60 257/88 |
| 2014/0291658 A1* | 10/2014 | Muller | H01L 51/5253 257/40 |

\* cited by examiner

WATERPROOF ELECTRONIC PACKAGING STRUCTURE AND METHOD FOR MAKING THE SAME

CROSS-REFERENCE TO RELATED APPLICATION

This application claims priority of Taiwanese Invention Patent Application No. 105127044, filed on Aug. 24, 2016.

FIELD

The disclosure relates to a packaging structure and a packaging process, and more particularly to a waterproof electronic packaging structure and a method for making the same.

BACKGROUND

An electronic chip is very sophisticated and is susceptible to moisture or dust. In addition, the electronic chip is miniaturized such that it is not easy to handle, store or transport. Since it is difficult to directly mount the miniaturized electronic chip to an electrical circuit board, the miniaturized electronic chip is often mounted to a carrier plate, which serves as a bridge between the miniaturized electronic chip and the electrical circuit board, followed by packaging the carrier plate and the miniaturized, electronic chip into an electronic packaging structure, such that the electronic packaging structure can be applied to a variety of electronic products.

A common way to package the electronic chip involves encapsulating chips and wires formed on the carrier plate with a packaging material, such as epoxy or silicone. However, after long-term use, moisture tends to permeate the packaging structure through an interface between the packaging material and the carrier plate, adversely affecting the reliability of the electronic packaging structure, which may lead to failure of the electronic packaging structure.

SUMMARY

Therefore, an object of the present disclosure is to provide a waterproof electronic packaging structure and a method for making a waterproof electronic packaging structure that can alleviate the drawbacks associated with the prior art.

A waterproof electronic packaging structure according to the present disclosure includes a carrier plate, a chip, an encapsulating member and a waterproof member.

The carrier plate includes a substrate, and a lead frame that is partly embedded in the substrate and that includes a chip bonding portion exposed from the substrate. The chip is mounted to the substrate and is electrically connected to the chip bonding portion of the leadframe. The encapsulating member is formed on the carrier plate, and encapsulates the chip and the chip bonding portion. The waterproof member is formed on the encapsulating member, and covers an outer surface of the encapsulatinq member and an interface between the encapsulating member and the substrate.

A method for making an electronic packaging structure according to the present disclosure includes:

providing a carrier plate that includes a substrate and a leadframe embedded in the substrate;

mounting a chip to the substrate and electrically connecting the chip to a chip bonding portion of the leadframe;

forming an encapsulating member on the carrier plate to encapsulate the chip and the chip bonding portion; and forming a waterproof member on the encapsulating member to cover an outer surface of the encapsulating member and an interface between the encapsulating member and the substrate.

BRIEF DESCRIPTION OF THE DRAWINGS

Other features and advantages of the present disclosure will become apparent in the following detailed description of the embodiment and modifications with reference to the accompanying drawings, of which.

DETAILED DESCRIPTION

Figure 1:
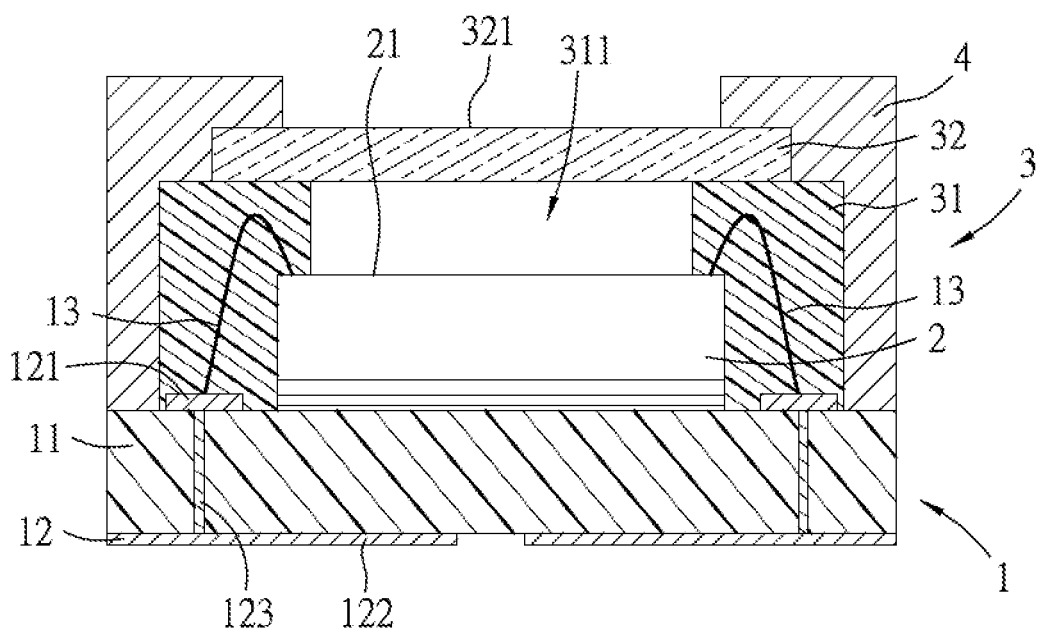
FIG. 1 is a partly cross sectional view of the first embodiment of a waterproof electronic packaging structure according to the present disclosure.
Figure 2:
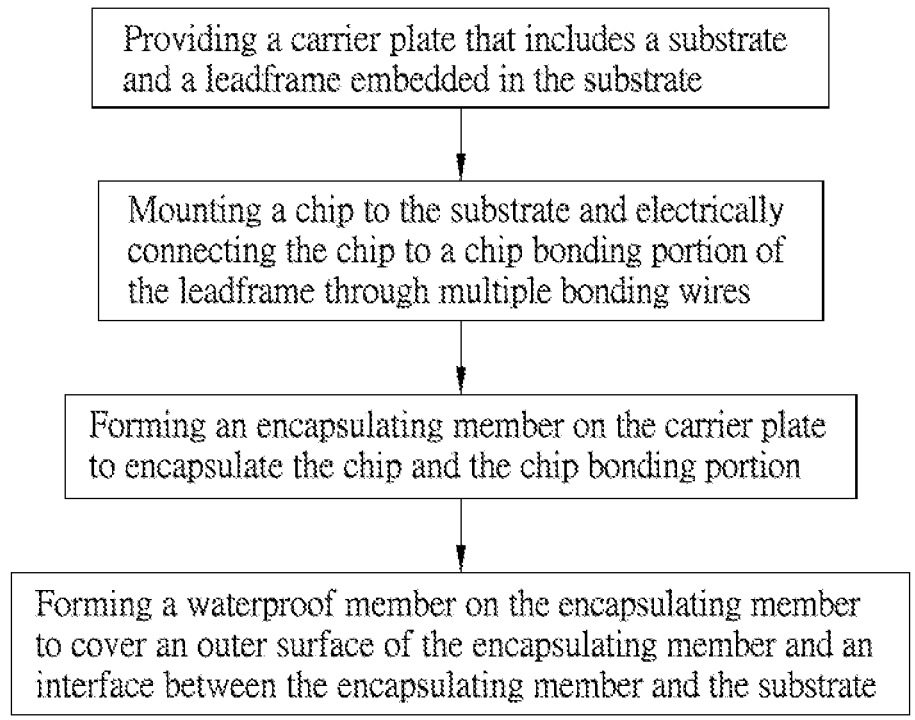
FIG. 2 is a flow chart of a method for manufacturing the first embodiment.
Figure 3:
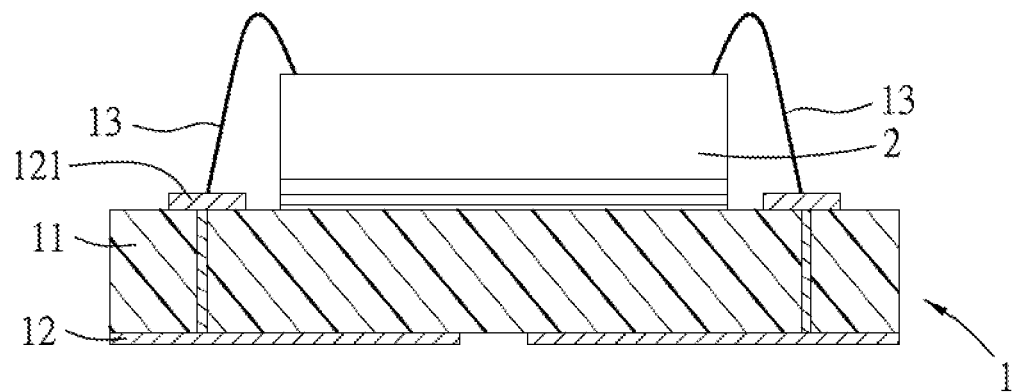
FIGS. 3 to 5 show consecutive steps of the method of FIG. 2.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a waterproof electronic packaging structure according to the present disclosure includes a carrier plate 1, a chip 2, an encapsulating member 3 and a waterproof member 4.

In this embodiment, the chip 2 is an optical sensor chip. The carrier plate 1 includes a substrate 11, and a leadframe 12 that is partly embedded in the substrate 11 and that is formed with a chip bonding portion 121 exposed from the substrate 11. The substrate 11 may be made of polymers or ceramics. In this embodiment, the substrate 11 is exemplified to be polymeric.

The chip 2 is mounted to the substrate 11 and is electrically connected to the chip bonding portion 121 of the leadframe 12 through a wire bonding process by using a plurality of bonding wires 13. Alternatively, the chip 2 may be electrically connected to the chip bonding portion 121 through other techniques, such as a flip chip process.

In this embodiment, the leadframe 12 further includes a terminal portion 122 exposed from the substrate 11 opposite to the chip bonding portion 121, and a connection portion 123 embedded in the substrate 11 and interconnecting the terminal portion 122 and the chip bonding portion 121.

The encapsulating member 3 is formed on the carrier plate 1, encapsulates the chip 2 and the chip bonding portion 121, and may be made of a resin material. In this embodiment, the encapsulating member 3 includes a main encapsulant layer 31 that surrounds the chip 2, that encapsulates the bonding wires 13 and that has a light opening 311 uncovering a surface area 21 of the chip 2, and a light-transmissible plate 32 that is disposed on the main encapsulant layer 31 and that covers the light opening 311 of the main encapsulant layer 31. In view of the optical sensing characteristic of the chip 2, the main encapsulant layer 31 maybe made of epoxy or silicone resin to form an opaque layer, thereby improving heat transmission efficiency of the waterproof electronic packaging structure and blocking ambient light from irradiating the chip 2. The light-transmissible plate 32 is exemplified to be made of a light-transmissible material, such as glass, so that the ambient light is allowed to penetrate the light-transmissible plate 32 to be sensed by the chip 2. The material and light transmittancy of the main encapsulant layer 31 and the light-transmissible plate 32 may foe changed based on practical requirements.

The waterproof member 4 is formed on the encapsulating member 3, and covers an outer surface of the encapsulating member 3 and an interface between the encapsulating member 3 and the substrate 11. Specifically, in this embodiment, the waterproof member 4 covers an outer surface of the main encapsulant layer 31, an interface between the main encapsulant layer 31 and the substrate 11, and an interface between the light-transmissible plate 32 and the main encapsulant layer 31. By covering the aforesaid interfaces, the ambient moisture may be prevented from permeating the waterproof electronic packaging structure so as to enhance the reliability of the chip 2. In addition, the waterproof member 4 uncovers a surface 321 of the light-transmissible plate 32 corresponding in position to the light opening 311, such that permeation of the ambient light will not foe blocked.

In certain embodiments, the waterproof member 4 is exemplified to be made of a metal that may foe selected from the group consisting of stainless steel, titanium, nickel-vanadium steel, copper, aluminum, and combinations thereof, as shown in FIG. 1. Alternatively, the waterproof member 4 is exemplified to be made of a dielectric material that is selected from the group consisting of aluminum oxide, silicon dioxide, silicon nitride, and combinations thereof.

Figure 4:
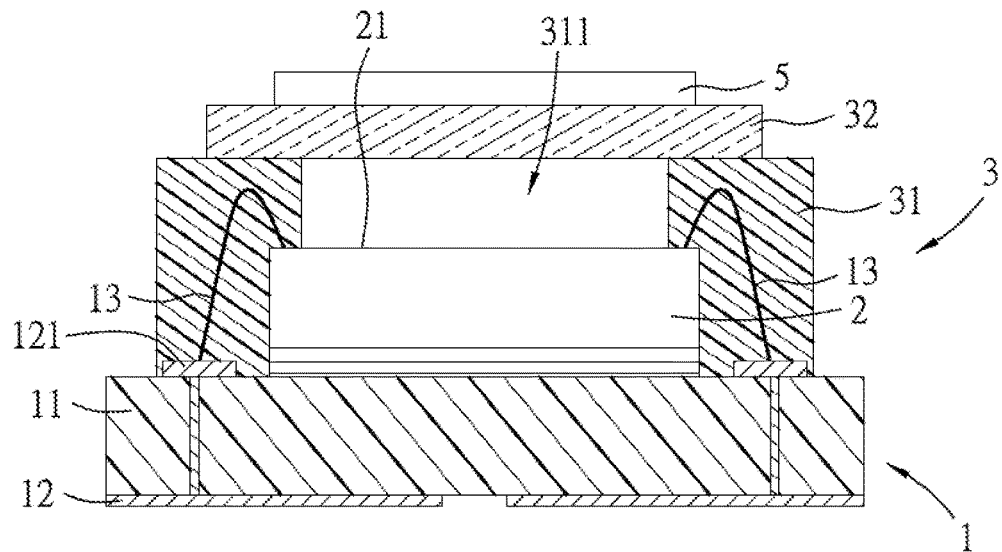
Figure 5:
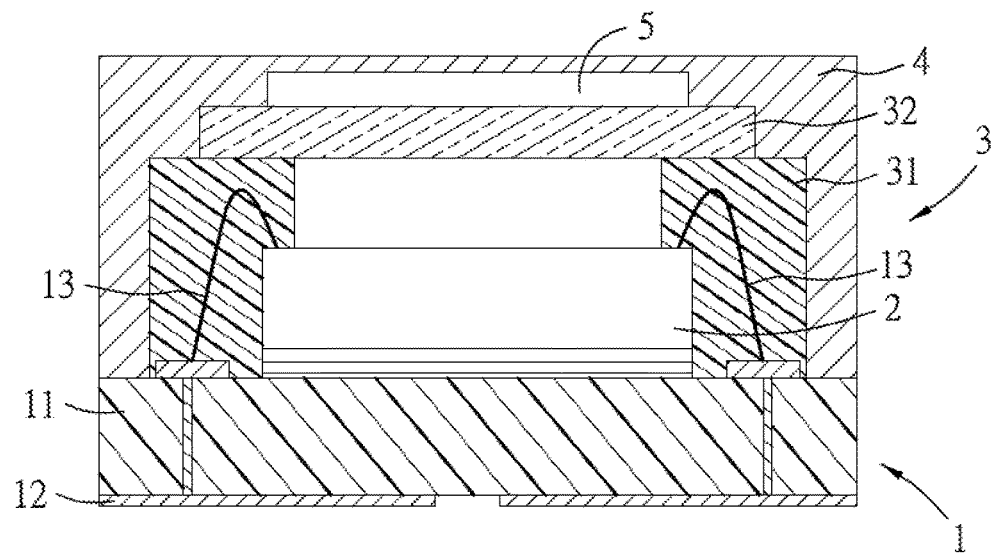

Referring to FIGS. 2 to 5, a method for manufacturing the waterproof electronic packaging structure shown in FIG. 1 includes: providing the carrier plate 1 that includes the substrate 11 and the leadframe 12 embedded in the substrate 11; mounting the chip 2 to the substrate 11 and electrically connecting the chip 2 to the chip bonding portion 121 of the leadframe 12 through the bonding wires 13 (see FIG. 3); forming the encapsulating member 3 on the carrier plate 1 to encapsulate the chip 2 and the chip bonding portion 121 (see FIG. 4); and forming the waterproof member 4 on the encapsulating member 3 to cover the outer surface of the encapsulating member 3 and the interface between the encapsulating member 3 and the substrate 11 (see FIG. 5).

In this embodiment, referring particularly to FIG. 4, the forming of the encapsulating member 3 includes: forming the main encapsulant layer 31 on the carrier plate 1 to surround the chip 2, where the main encapsulant layer 31 has the light opening 311 that uncovers the surface area 21 of the chip 2; forming the light-transmissible plate 32 on the main encapsulant layer 31 such that the light opening 311 is covered by the light-transmissible plate 32; and forming a protecting member 5 on the light-transmissible plate 32 in a position corresponding to the light opening 311.

In this embodiment, referring particularly to FIG. 5, the forming of the waterproof member 4 includes: molding the waterproof member 4 over the outer surface of the main encapsulant layer 31, the interface between the light-transmissible plate 32 and the main encapsulant layer 31, and at least a portion of the protecting member 5; and removing the protecting member 5 and a portion of the waterproof member 4 formed on the protecting member 5 (see FIG. 1).

In certain embodiments, the main encapsulant layer 31 is formed by glue potting technique, followed by forming the light-transmissible plate 32 on the main encapsulant layer 31. Subsequently, the main encapsulant layer 31 is solidified to protect the chip 2 and to be bonded to the light-transmissible plate 32.

In this embodiment, the waterproof member 4 is formed by sputtering deposition or evaporation deposition. Alternatively, the waterproof member 4 is formed by sputtering deposition or evaporation deposition, followed by electroplating a metal layer, such as a copper layer, a nickel layer, etc. to improve corrosion resistance of the waterproof member 4.

Figure 6:
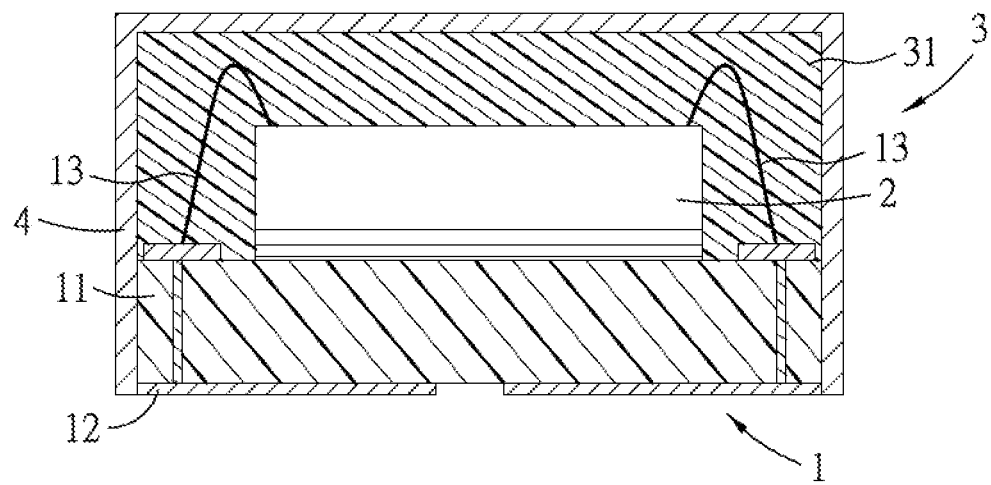
FIG. 6 is a partly cross sectional view of a modification of the waterproof electronic packaging structure of FIG. 1 according to the present disclosure.

Referring to FIG. 6, the waterproof electronic packaging structure according to the present disclosure is modified such that the light-transmissible plate 32 is omitted. The main encapsulant layer 31 of the encapsulating member 3 entirely covers the chip 2, and the waterproof member 4 entirely covers the main encapsulant layer 31.

Figure 7:
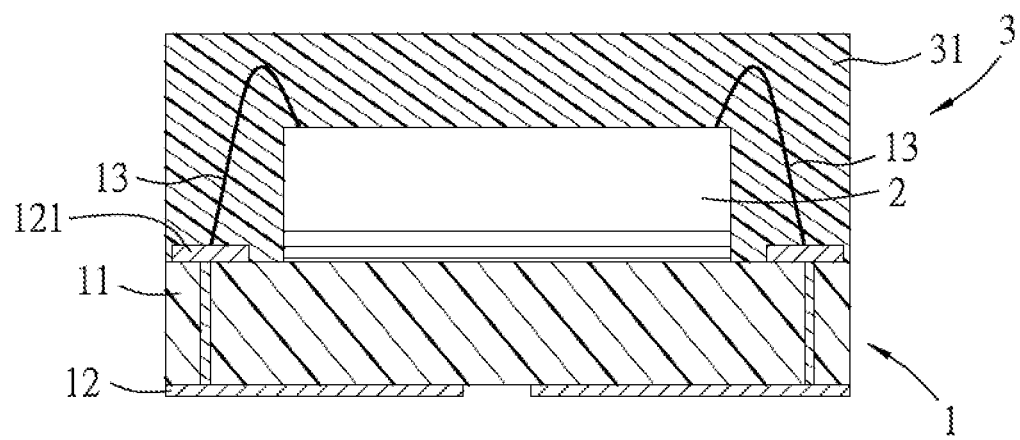
FIG. 7 is a partly cross sectional view of the modification of FIG. 6, showing a main encapsulant layer of an encapsulating member entirely covering a chip.

Referring to FIG. 7, when the waterproof electronic packaging structure shown in FIG. 6 is being manufactured, the forming of the encapsulating member 3 includes forming the main encapsulant layer 31 on the carrier plate 1 to encapsulate the chip 2, the chip bonding portion 121 of the leadframe 12 and the bonding wires 13. The forming of the waterproof member 4 includes forming the waterproof member 4 to entirely cover the main encapsulant layer 31 of the encapsulating member 3 and the interface between the main encapsulant layer 31 and the substrate 11.

In summary, by using the waterproof member 4 to cover the interface between the main encapsulant layer 31 and the substrate 11, and the interface between the main encapsulant layer 31 and the light-transmissible plate 32, the ambient moisture may be prevented from penetrating the waterproof electronic packaging structure so as to enhance the reliability of the chip 2.

In the description above, for the purposes of explanation, numerous specific details have been set forth in order to provide a thorough understanding of the embodiment and modifications. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiment and modifications, it is understood that this disclosure is not limited to the disclosed embodiment and modifications but is intended to cover various arrangements included within the spirit and scope of the broadest interpretation so as to encompass all such modifications and equivalent arrangements.

What is claimed is:

1. A waterproof electronic packaging structure comprising:
   a carrier plate that includes a substrate, and a leadframe that is partly embedded in said substrate and includes a chip bonding portion exposed from said substrate;
   a chip that is mounted to said substrate and is electrically connected to said chip bonding portion of said leadframe;

an encapsulating member that is formed on said carrier plate, and encapsulates said chip and said chip bonding portion; and a waterproof member that is formed on said encapsulating member, and covers an outer surface of said encapsulating member and an interface between said encapsulating member and said substrate, wherein said encapsulating member includes a main encapsulant layer that surrounds said chip and has a light opening uncovering a surface area of said chip, and a light-transmissible plate that is disposed on said main encapsulant layer and covers said light opening of said main encapsulant layer, wherein said waterproof member covers an outer surface of said main encapsulant layer, an interface between said main encapsulant layer and said substrate, and an interface between said light-transmissible plate and said main encapsulant layer, and wherein said waterproof member uncovers a surface area of said light-transmissible plate corresponding in position to said light opening.

2. The waterproof electronic packaging structure as claimed in claim 1, wherein said encapsulating member is made of a resin material.

3. The waterproof electronic packaging structure as claimed in claim 1, wherein said waterproof member is made of a metal.

4. The waterproof electronic packaging structure as claimed in claim 3, wherein the metal is selected from the group consisting of stainless steel, titanium, nickel-vanadium steel, copper, aluminum, and combinations thereof.

5. The waterproof electronic packaging structure as claimed in claim 1, wherein said waterproof member is made of a dielectric material.

6. The waterproof electronic packaging structure as claimed in claim 5, wherein the dielectric material is selected from the group consisting of aluminum oxide, silicon dioxide, silicon nitride, and combinations thereof.

7. A method for making the waterproof electronic packaging structure of claim 1, comprising:

providing the carrier plate that includes the substrate and the leadframe embedded in the substrate;

mounting the chip to the substrate and electrically connecting the chip to the chip bonding portion of the leadframe;

forming the encapsulating member on the carrier plate to encapsulate the chip and the chip bonding portion; and forming the waterproof member on the encapsulating member to cover the outer surface of the encapsulating member and the interface between the encapsulating member and the substrate.

8. The method as claimed in claim 7, wherein the forming of the encapsulating member includes:

forming the main encapsulant layer on the carrier plate to surround the chip, the main encapsulant layer having the light opening that uncovers the surface area of the chip;

forming the light-transmissible plate on the main encapsulant layer such that the light opening is covered by the light-transmissible plate; and forming a protecting member on the light-transmissible plate in a position corresponding to the light opening, and the forming of the waterproof member includes:

molding the waterproof member over the outer surface of the main encapsulant layer, the interface between the light-transmissible plate and the main encapsulant layer, and at least a portion of the protecting member; and removing the protecting member and a portion of the waterproof member fanned on the protecting member.

9. The method as claimed in claim 7, wherein the waterproof member is formed by one of sputtering deposition and evaporation deposition.

10. The method as claimed in claim 7, wherein the waterproof member is formed by one of sputtering deposition and evaporation deposition, followed by electroplating.

11. A waterproof electronic packaging structure comprising:

a carrier plate that includes a substrate, and a leadframe that is partly embedded in said substrate and includes a chip bonding portion exposed from said substrate;

a chip that is mounted to said substrate and is electrically connected to said chip bonding portion of said leadframe;

an encapsulating member that is formed on said carrier plate, encapsulates said chip and said chip bonding portion, and entirely covers said chip; and a waterproof member that is formed on said encapsulating member, covers an outer surface of said encapsulating member and an interface between said encapsulating member and said substrate, and entirely covers said encapsulating member;

wherein said waterproof member is made of a metal.

12. The waterproof electronic packaging structure as claimed in claim 11, wherein said encapsulating member is made of a resin material.

13. The waterproof electronic packaging structure as claimed in claim 11, wherein the metal is selected from the group consisting of stainless steel, titanium, nickel-vanadium steel, copper, aluminum, and combinations thereof.

14. A method for making a waterproof electronic packaging structure of claim 11, comprising:

providing the carrier plate that includes the substrate and the leadframe embedded in the substrate;

mounting the chip to the substrate and electrically connecting the chip to the chip bonding portion of the leadframe;

forming the encapsulating member on the carrier plate to encapsulate the chip and the chip bonding portion; and forming the waterproof member on the encapsulating member to cover the outer surface of the encapsulating member and the interface between the encapsulating member and the substrate.

15. The method as claimed in claim 14, wherein the forming of the encapsulating member includes:

forming a main encapsulant layer on the carrier plate to surround the chip, the main encapsulant layer having a light opening that uncovers a surface area of the chip;

forming a light-transmissible plate on the main encapsulant layer such that the light opening is covered by the light-transmissible plate; and forming a protecting member on the light-transmissible plate in a position corresponding to the light opening, and the forming of the waterproof member includes:

molding the waterproof member over an outer surface of the main encapsulant layer, an interface between the light-transmissible plate and the main encapsulant layer, and at least a portion of the protecting member; and removing the protecting member and a portion of the waterproof member formed on the protecting member.

16. The method as claimed in claim 14, wherein the waterproof member is formed by one of sputtering deposition and evaporation deposition.

17. The method as claimed in claim 14, wherein the waterproof member is formed by one of sputtering deposition and evaporation deposition, followed by electroplating.

* * * * *